United States Patent [19]
Aoude et al.

[11] Patent Number: 5,925,443
[45] Date of Patent: Jul. 20, 1999

[54] COPPER-BASED PASTE CONTAINING COPPER ALUMINATE FOR MICROSTRUCTURAL AND SHRINKAGE CONTROL OF COPPER-FILLED VIAS

[75] Inventors: Farid Youssif Aoude; Lawrence Daniel David, both of Wappingers Falls, N.Y.; Renuka Shastri Divakaruni, Ridgefield, Conn.; Shaji Farooq; Lester Wynn Herron, both of Hopewell Junction, N.Y.; Hal Mitchell Lasky, Hyde Park, N.Y.; Anthony Mastreani, Hopewell Junction, N.Y.; Govindarajan Natarajan, Pleasant Valley, N.Y.; Srinivasa S. N. Reddy, LaGrangeville, N.Y.; Vivek Madan Sura, Hopewell Junction, N.Y.; Rao Venkateswara Vallabhaneni; Donald Rene Wall, both of Wappingers Falls, N.Y.

[73] Assignee: International Business Machines Corporation, Armonk, N.Y.

[21] Appl. No.: 07/758,991

[22] Filed: Sep. 10, 1991

[51] Int. Cl.$^6$ ........................................... H01B 1/06
[52] U.S. Cl. .................... 428/209; 428/428; 428/457; 428/469; 428/472; 428/323; 428/325; 428/901; 428/697; 252/512; 252/518
[58] Field of Search ...................... 428/195, 209, 428/210, 469, 472, 697, 901, 457; 252/512, 518; 106/1.23, 1.26

[56] References Cited

U.S. PATENT DOCUMENTS

| | | | |
|---|---|---|---|
| 4,072,771 | 2/1978 | Grier, Sr. | 428/209 |
| 4,090,009 | 5/1978 | Horowitz | 428/210 |
| 4,234,367 | 11/1980 | Herron et al. | 156/89 |
| 4,301,324 | 11/1981 | Kumar et al. | 174/68.5 |
| 4,503,090 | 3/1985 | Brown et al. | 252/518 |
| 4,584,181 | 4/1986 | Siuta | 252/512 |
| 4,599,277 | 7/1986 | Brownlow et al. | 428/552 |
| 4,636,257 | 1/1987 | Baudry et al. | 252/518 |
| 4,776,978 | 10/1988 | Herron et al. | 252/512 |
| 4,865,772 | 9/1989 | Suehiro et al. | 252/512 |
| 4,906,405 | 3/1990 | Nakatani et al. | 252/518 |
| 5,004,640 | 4/1991 | Nakatani et al. | 428/795 |

FOREIGN PATENT DOCUMENTS

| | | | |
|---|---|---|---|
| 0272129 | 12/1987 | European Pat. Off. | H05K 3/12 |
| 63-095182 | 4/1988 | Japan | C04B 41/88 |

OTHER PUBLICATIONS

Farooq, et al., U.S. Patent Application S/N 07/672,517, filed Mar. 20, 1991 (to be issued as U.S. Pat. 5,073,180 on Dec. 17, 1991).

*Primary Examiner*—Archene Turner
*Attorney, Agent, or Firm*—Ira D. Blecker

[57] ABSTRACT

A copper-based paste is disclosed for filling vias in, and forming conductive surface patterns on, ceramic substrate packages for semiconductor chip devices. The paste contains copper aluminate powder in proper particle size and weight proportion to achieve grain size and shrinkage control of the via and thick film copper produced by sintering. The shrinkage of the copper material during sintering is closely matched to that of the ceramic substrate.

5 Claims, No Drawings

COPPER-BASED PASTE CONTAINING COPPER ALUMINATE FOR MICROSTRUCTURAL AND SHRINKAGE CONTROL OF COPPER-FILLED VIAS

BACKGROUND OF THE INVENTION

The present invention generally relates to copper-filled vias in ceramic substrates and, more particularly, to a copper-based paste containing copper aluminate powder in proper particle size and weight proportion for grain size and shrinkage control of the via and thick film copper produced by sintering.

The use of copper-filled vias in ceramic substrates and sintering processes for producing them are well known in the semiconductor packaging art as taught, for example, in U.S. Pat. No. 4,234,367, issued on Nov. 18, 1980 to Lester W. Herron et al. and assigned to the present assignee, the disclosure of which is incorporated by reference herein. Recently, more interest has been focused on the associated problems of the disparity in shrinkage rates between copper and ceramic as well as the onset of via "opens", particularly as via diameters are reduced below 100 μm in high circuit density applications. A discussion of such problems is given in U.S. Pat. No. 4,776,978, issued on Oct. 11, 1988 to Lester W. Herron et al. and assigned to the present assignee, the disclosure of which is incorporated by reference herein.

As set forth in the cited U.S. Pat. No. 4,776,978 patent, metal particles, such as copper, in the via paste undergo sintering with attendant shrinkage of the thick film pattern (also consisting of the paste) during the initial phase of the sintering cycle whereas the ceramic and glass particles (of the ceramic substrate containing the vias) undergo sintering during the intermediate and final phases of the sintering cycle along with their characteristic shrinkage. One method of delaying the onset of sintering of the metal particles until at least the intermediate phase of the sintering cycle is to intersperse the metal particles in the thick film with a high melting point material such as aluminum oxide.

Although the foregoing generalized considerations have been known in the art for some time and have provided the basis for techniques for overcoming previous shrinkage and related problems, more refined and detailed approaches are required to meet the needs of copper-filled vias in ceramic substrates with increasing circuit densities and the concomitant via diameters in the range of about 85 to 100 μm. It is also desirable to provide a copper paste mixture which can be adapted for use with the next generation of ceramic packages which exhibit reduced shrinkage from sintering.

The following references illustrate previous techniques attempting to overcome shrinkage and other problems.

U.S. Pat. No. 4,594,181, issued on Jun. 10, 1986 to Vincent P. Siuta, teaches the dispersal of copper particles in a solution of an organometallic compound in an anhydrous volatile organic solvent towards obtaining a better shrinkage match of copper to ceramic substrate during sintering.

U.S. Pat. No. 4,599,277, issued on Jul. 8, 1986 to James M. Brownlow et al., discloses the addition of an organometallic compound to a metal member such as copper paste which compound undergoes decomposition during sintering to provide a coating such as aluminum oxide on the copper particles towards obtaining better shrinkage match between copper and ceramic substrate during sintering.

Published European Patent Application, Publication No. 0272129, published Jun. 22, 1988 by Hitoshi Suzuki et al., describes a paste composition including a copper powder and an organometallic compound such as an organoaluminate compound, towards obtaining improved adhesion strength of sintered copper to a ceramic substrate.

U.S. Pat. No. 4,906,405, issued on Mar. 6, 1990 to Seiichi Nakatani et al. and Japanese Patent J63095182, issued on Apr. 26, 1988 to Goei Seisakusho KK, teach a paste made of copper oxide, and $CuAl_2O_4$ as an additive towards obtaining improved adhesion strength of sintered copper to a ceramic substrate.

SUMMARY OF THE INVENTION

One object of the present invention is to provide a copper paste with appropriate additive to produce copper grain size in the range of about 5 to 15 μm after sintering.

Another object is to provide a copper paste with an appropriate additive to substantially match the shrinkage of the resulting copper material to the shrinkage, if any, during sintering of a ceramic substrate having vias filled with said copper paste.

A further object is to provide a copper paste with an appropriate additive to provide substantially reduced shrinkage after sintering of the copper material in low shrinkage porous ceramic substrates having vias filled with said copper paste.

These and other objects of the present invention, as will be seen from a reading of the following specification, are achieved in a preferred embodiment of the present invention by the provision of a copper paste comprising copper powder, up to about 10 weight percent copper aluminate powder, and the remainder organic material. Use of copper aluminate in one preferred range from about 0.4 to about 1 weight percent provides the dual benefits of grain size control as well as shrinkage matching control of the via copper during sintering.

It is preferred that the size of the copper aluminate particles be in the range of about 3.0 μm or less because the amount of copper aluminate required for grain size control of the sintered Cu varies inversely with copper aluminate particle size.

In a preferred embodiment of the invention, glass-ceramic particles are added to the copper-based paste to provide a shrinkage match during sintering that is substantially identical to that of a glass-ceramic substrate.

DETAILED DESCRIPTION OF THE INVENTION

Multilayered glass-ceramic packages for supporting and interconnecting microelectronic chip devices can be sintered to a peak temperature greater than 950° C. Because of the high temperatures, the chip interconnecting copper conductors tend to experience exaggerated grain growth in the vias and in the thick film copper wiring lines.

The growth of large grains in copper is not desirable from the point of view of reliability. The reason for this is that the plasticity of copper varies with the orientation of two neighboring large copper grains and the grains may separate when they are cooled down from high temperature and on subsequent thermal cycling. Inasmuch as the conductor size in both the vias and surface lines is about 70–100 μm, it is desirable to keep the copper grain size after sintering as small as possible, namely about 5–15 μm.

In accordance with a first aspect of the present invention, copper grain size is minimized in a sintering cycles such as the one disclosed in the aforementioned U.S. Pat. No. 4,234,367 patent. Copper grain size is minimized by adding a small amount of copper aluminate powder to copper powder, mixing with suitable organics to form a paste, and then screening the paste using a mask on to a green sheet. The green sheet may comprise a variety of materials including, but not limited to, mullite, borosilicate glass, cordierite glass, ceramic, etc. The cordierite glass ceramic materials, such as that disclosed in Kumar et al. U.S. Pat. No. 4,301,324, the disclosure of which is incorporated by reference herein, are preferred. Preferably, the copper powder has an average particle size of about 5–8 μm and the copper aluminate powder has an average particle size of about 3.0 μm or less.

There are two forms of copper aluminate, namely cupric aluminate ($CuAl_2O_4$) and cuprous aluminate ($CuAlO_2$). Unless specifically stated otherwise, whenever copper aluminate is mentioned in this specification, it should be understood that copper aluminate is being used in the generic sense to include cupric aluminate and cuprous aluminate, both of which should be considered to be within the scope of the present invention.

When suitable conditions are present in a sintering cycle such as taught in the U.S. Pat. No. 4,234,367 patent, copper aluminate decomposes into copper and alumina according to the following reactions:

$$CuAl_2O_4 + H_2 = Cu + Al_2O_3 + H_2O$$

$$2CuAlO_2 + H_2 = 2Cu + Al_2O_3 + H_2O$$

The alumina particles produced by the foregoing decomposition reactions are very small, submicron in size, and are distributed inside the copper matrix. The presence of a small amount of porosity and the small alumina particles inside the copper matrix have been found to inhibit copper grain growth and result in small copper grains after sintering at high temperature in excess of 950° C.

More particularly, the unique use of powdered copper aluminate in the copper paste, in accordance with the present invention, has the special property of yielding grain size control of the sintered copper.

By adding powdered copper aluminate to copper paste, preferably in the range 0.2–1.0% by weight, the sintered copper grain size can be kept small. More importantly, the maximum grain size can be kept under about 20 μm, which improves the reliability of multilayer ceramic packages having copper conductors. It should be noted that by decreasing the particle size of the copper aluminate powder, smaller copper grain sizes can be obtained with lower weight percentage additions of the copper aluminate to the copper paste.

In general terms, grain size control is the predominant effect when the powdered copper aluminate paste additive is present up to about 1 weight percent. Grain size control aids in avoiding opens (breaks) in the sintered copper vias and circuits which have been experienced using other paste additives which produce much larger copper grain sizes after sintering.

It has been found that additions to the sintering paste of copper aluminate up to about 10 weight percent are useful for controlling the shrinkage of the sintered copper. With increasing amounts of copper aluminate, but not greater than about 10 weight percent, the sintered copper becomes porous, i.e., the copper particles continue to shrink microscopically but not on a macro (global) scale. At about 10 weight percent copper aluminate, the copper no longer undergoes shrinkage upon sintering. It is more preferred that the copper aluminate be kept at about 3 weight percent or less since at higher amounts of copper aluminate, the sintered copper has lower strength and increased electrical resistivity.

It has further been found that shrinkage control is possible when there is present, as a minimum, a small but effective amount of copper aluminate. The lower limits have not been determined yet with precision. It is known that about 0.01 weight percent of alumina will induce shrinkage control. It is assumed, therefore, that amounts of copper aluminate (about 0.02 weight percent) that will yield about 0.01 weight percent alumina will also achieve similar shrinkage control, given similar particle sizes. Smaller amounts of copper aluminate are likely to be effective if the particle size of the copper aluminate, now at about 3.0 μm, is reduced further.

As is apparent, the effects of grain size control and shrinkage control may advantageously overlap at small amounts of copper aluminate additions.

It would be most desirable to match or substantially match shrinkage characteristics during sintering of the copper vias and lines with that of a glass-ceramic, particularly a cordierite glass-ceramic, material. Thus, in a preferred embodiment of the invention, there is proposed a copper-based sintering paste comprising copper particles, glass-ceramic particles, copper aluminate, and suitable organic binder materials. Based on volume percent of the inorganic solids, the paste comprises about 90 volume percent copper particles, about 5 to 12 volume percent glass-ceramic particles and about 0.3–1.5 volume percent copper aluminate.

It is preferred that the copper particles have a bimodal distribution. Although a unimodal distribution of the copper particles (preferably having an average particle size of 5–8 μm) will also work well. More preferably, there should be about 60–90 volume percent copper particles having an average particle size of 5 to 6 μm and 0–30 volume percent of copper particles having an average particle size of 1.5 to 2.0 μm. Also preferably, the copper aluminate particles should have an average particle size of 0.7 to 3.0 μm.

It is anticipated that the present invention will have applicability to many glass-ceramic materials. The preferred glass-ceramic materials, however, are the cordierite glass-ceramics disclosed in the Kumar et al. U.S. Pat. No. 4,301,324. The average particle size of the glass-ceramic particles should be about 3.5 μm.

The advantages of the present invention will become more apparent after referring to the following examples.

EXAMPLES

Examples I

A series of samples were prepared comprising copper particles and varying amounts of copper aluminate in order to determine the efficacy of copper aluminate as a grain size control agent.

Batches of copper powder particles (from Metz Metallurgical and Dupont), having an average particle size of 6 μm, were mixed with copper aluminate ($CuAl_2O_4$), having an average particle size of about 2.5 μm, and various paste additives, including ethyl cellulose resin plus a solvent, wetting agent, and flow control agent. Each batch was dried in an oven at about 100° C. and then milled in a rod mill for 1–2 hours. Thereafter, the paste was pressed into pellets at about 5000 psi. Finally, the pellets were sintered in a sintering cycle such as that disclosed in the above Herron et al. U.S. Pat. No. 4,234,367.

The pellets were examined for grain size and the results are illustrated in Table I. As can be seen, the grain size is markedly reduced when at least 0.2 weight percent copper aluminate is present in the paste.

TABLE I

| Weight % Copper Aluminate in Paste | Average Grain Size in Copper ($\mu$m) | Maximum Grain Size In Copper ($\mu$m) |
|---|---|---|
| 0 | 18 | 53 |
| 0 | >20 | >100 |
| 0.2 | 13 | 55 |
| 0.4 | 13 | 41 |
| 0.5 | 9 | 18 |
| 0.6 | 8 | 15 |
| 0.8 | 8 | 19 |
| 1.0 | 7 | 14 |

The pellets were also examined for densification, noted as percent of theoretical density, and resistivity. The results are illustrated in Table II. The samples listed in Table II only used the Metz copper powder particles. As can be seen, there is a steady decline in percent theoretical density achieved with increasing amounts of copper aluminate, thus illustrating the ability to control the shrinkage of the sintered copper.

TABLE II

| Weight % Copper Aluminate in Paste | % of Theoretical Density | Resistivity $\mu$-ohm-cm |
|---|---|---|
| 0.3 | 93 | |
| 0.4 | 91 | 2.2 |
| 1.0 | 80 | 2.9 |
| 1.2 | 76 | 3.1 |
| 2.0 | 73 | |
| 3.0 | 69 | |
| 10.0 | 55 | |

Examples II

Samples were prepared comprising copper particles, copper aluminate particles and glass-ceramic particles in order to determine whether it is possible to match the shrinkage characteristics during sintering of a copper paste and a glass-ceramic material.

A batch of copper-based paste was prepared having the following composition, by volume percent of inorganic materials: 10.08 volume percent of copper (from Metz Metallurgical) having an average particle size of 1.5 $\mu$m, 79.26 volume percent of copper (from Metz Metallurgical) having an average particle size of 6 $\mu$m, 9.9 volume percent of cordierite glass-ceramic particles (average particle size of 3.5 $\mu$m) of the composition listed in Table III, and 0.76 volume percent of copper aluminate having an average particle size of 0.6 $\mu$m. To this mixture was added various past additions, including ethyl cellulose resin plus a solvent, wetting agent, and flow control agent. The resulting mixture was dried in an oven at about 100° C. and then milled in a rod mill for 1 to 2 hours. Thereafter, the paste was pressed into pellets at about 5000 psi.

TABLE III

| Glass-ceramic in paste, weight % | | Substrate Glass-Ceramic, weight % |
|---|---|---|
| 55.0 | $SiO_2$ | 55.0 |
| 21.23 | $Al_2O_3$ | 21.1 |
| 20.0 | MgO | 22.3 |
| 1.0 | $B_2O_3$ | 1.3 |
| 2.77 | $P_2O_5$ | 0.3 |

Next, a batch of glass-ceramic material (average particle size 3.5 $\mu$m) representative of glass-ceramic material in substrates was prepared. The composition is also listed in Table III. The glass-ceramic material was prepared in a conventional way such as that disclosed in the Herron et al. U.S. Pat. No. 4,234,367, and then pressed into pellets.

Both sets of pellets were sintered according to the sintering cycle disclosed in the above Herron et al. patent as modified by Farooq et al. U.S. patent application Ser. No. 07/672,517, filed Mar. 20, 1991, the disclosure of which is incorporated by reference herein.

Generally speaking, the sintering cycle proceeds as follows. The temperature was ramped up to 715° C. in an atmosphere of 70% water vapor/30% $N_2$ followed by binder burnoff in a steam ambient. Subsequently, the atmosphere was replaced with a forming gas atmosphere and then the temperature was ramped up to 975° C. in $N_2$. The atmosphere is then changed to a steam ambient and heating at 975° C. continued to complete the second step. The pellets were then cooled down, first in the steam ambient and then in $N_2$.

The shrinkage behavior of the pellets was measured during the sintering cycle by a Netzsch dilatometer. It was observed that the glass-ceramic pellets (representing the substrate) began to shrink at about 800° C. and stopped shrinking at about 860° C., while the paste pellets began to shrink at about 800° C. and stopped shrinking at about 890° C. Thus, both sets of pellets exhibited nearly identical shrinkage behavior. According to the invention, therefore, shrinkage matching of paste and substrate materials is obtained.

As is now apparent, the copper-based sintering paste comprising copper aluminate proposed by the present inventors has fulfilled the dual objectives of controlling the grain size in the sintered copper while also altering the shrinkage behavior of the copper particles.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A multilayered ceramic package comprising:

a glass-ceramic substrate; and a copper-based sintering paste for forming conductive vias and surface patterns in or on said glass-ceramic substrate, said paste comprising, by volume percent of inorganic solids:

90 volume percent of copper particles, 5–12 volume percent of glass-ceramic particles, 0.3–1.5 volume percent of copper aluminate particles, and organic materials.

2. The ceramic package defined in claim 1 wherein said copper particles in said sintering paste have a bimodal distribution.

3. The ceramic package defined in claim 2 wherein said copper particle bimodal distribution comprises, by volume percent of inorganic solids:

60–90 volume percent of copper particles having an average particle size of 5 to 6 micrometers and 0–30 volume percent of copper particles having an average particle size of 1.5 to 2.0 micrometers.

4. The ceramic package defined in claim 1 wherein in said sintering paste said glass-ceramic particles have an average particle size of 3.5 micrometers and said copper aluminate particles have an average particle size of 0.7–3.0 micrometers.

5. The ceramic package defined in claim 1 wherein said sintering paste substantially matches the shrinkage characteristics of said glass-ceramic substrate during sintering.

* * * * *